United States Patent
Aoki et al.

(10) Patent No.: US 8,533,249 B2
(45) Date of Patent: Sep. 10, 2013

(54) WEIGHT FUNCTION GENERATING METHOD, REFERENCE SIGNAL GENERATING METHOD, TRANSMISSION SIGNAL GENERATING APPARATUS, SIGNAL PROCESSING APPARATUS AND ANTENNA

(75) Inventors: Yoshirou Aoki, Yokohama (JP); Masakazu Wada, Tokyo (JP); Junichi Horikomi, Yokohama (JP); Shinkichi Nishimoto, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1588 days.

(21) Appl. No.: 11/075,670

(22) Filed: Mar. 10, 2005

(65) Prior Publication Data

US 2005/0203730 A1    Sep. 15, 2005

(30) Foreign Application Priority Data

Mar. 11, 2004    (JP) .................... 2004-068911

(51) Int. Cl.
*G06F 17/10*    (2006.01)
(52) U.S. Cl.
USPC ............................ 708/300; 708/315; 708/321
(58) Field of Classification Search
USPC .................................. 708/300–409
See application file for complete search history.

(56) References Cited

U.S. PATENT DOCUMENTS

| | | | | |
|---|---|---|---|---|
| 3,808,412 A * | 4/1974 | Smith | ............................ | 708/316 |
| 3,883,726 A * | 5/1975 | Schmidt | ......................... | 708/404 |
| 4,282,579 A * | 8/1981 | Speiser et al. | ................. | 708/405 |
| 5,612,978 A * | 3/1997 | Blanchard et al. | ............. | 708/300 |
| 5,768,165 A * | 6/1998 | Palicot et al. | .................. | 708/300 |
| 6,181,135 B1 * | 1/2001 | Shen | .............................. | 324/307 |
| 6,298,363 B1 * | 10/2001 | Iannuzzelli | .................... | 708/400 |
| 6,529,927 B1 * | 3/2003 | Dunham | ........................ | 708/400 |
| 6,687,422 B1 * | 2/2004 | Chen et al. | ...................... | 708/403 |
| 6,868,114 B2 * | 3/2005 | Bially et al. | ................... | 708/404 |
| 6,968,352 B1 * | 11/2005 | Gilloire et al. | ................ | 708/300 |
| 7,023,938 B1 * | 4/2006 | Kapoor et al. | ................ | 708/323 |
| 7,277,475 B1 * | 10/2007 | Nguyen et al. | ................ | 375/148 |
| 7,366,243 B1 * | 4/2008 | McCrady | ....................... | 375/259 |
| 2004/0186867 A1 * | 9/2004 | Schenk | ........................ | 708/300 |

FOREIGN PATENT DOCUMENTS

| | | |
|---|---|---|
| JP | 11-194166 | 7/1999 |
| JP | 2002-181921 | 6/2002 |

OTHER PUBLICATIONS

U.S. Appl. No. 12/700,228, filed Feb. 4, 2010, Mizutani et al.
U.S. Appl. No. 12/700,209, filed Feb. 4, 2010, Mizutani et al.
U.S. Appl. No. 12/821,614, filed Jun. 23, 2010, Ishizawa, et al.
U.S. Appl. No. 12/825,740, filed Jun. 29, 2010, Mizutani, et al.
U.S. Appl. No. 12/825,819, filed Jun. 29, 2010, Mizutani, et al.

* cited by examiner

*Primary Examiner* — Chuong D Ngo
(74) *Attorney, Agent, or Firm* — Oblon, Spivak, McClelland, Maier & Neustadt, L.L.P.

(57) ABSTRACT

A rectangular wave for determining a range of a weight function is transformed to frequency domain by an FFT or the like, and after being multiplied by a window function (Blackman-Harris window function, for example) generated on a frequency axis by a multiplier, the frequency domain is transformed again to the time domain by an IFFT or the like thereby to generate a weight function.

14 Claims, 11 Drawing Sheets

WEIGHT FUNCTION GENERATING METHOD, REFERENCE SIGNAL GENERATING METHOD, TRANSMISSION SIGNAL GENERATING APPARATUS, SIGNAL PROCESSING APPARATUS AND ANTENNA

CROSS-REFERENCE TO RELATED APPLICATIONS

This application is based upon and claims the benefit of priority from prior Japanese Patent Application No. 2004-068911, filed Mar. 11, 2004, the entire contents of which are incorporated herein by reference.

BACKGROUND OF THE INVENTION

1. Field of the Invention

The present invention relates to a technique for preprocessing of a weight function, etc. attaching a predetermined characteristic to a waveform signal in time domain, and primarily to a signal processing technique intended to suppress and reduce spurious components and a side lobe of a transmission signal generating apparatus, a signal processing apparatus and an antenna unit.

2. Description of the Related Art

In a conventional radar device, as described in, for example, Jpn. Pat. Appln. KOKAI Publication Nos. 11-194166 and 2002-181921, the coefficient of a weight function is produced in time domain and multiplied by a reception signal in order to reduce the side lobe level in signal processing, pulse compression and aperture plane distribution of an antenna.

This processing in time domain, however, cannot suppress the side lobe in frequency domain, and the signal processing loss poses a great problem. Under the circumstances, however, the aperture plane distribution of the antenna is generally accompanied by a large loss, and the side lobe level is not sufficiently reduced. Further, the spurious frequency component of the transmission signal often cannot be suppressed sufficiently. Furthermore, in the correlation processing in the pulse compression, etc., the unnecessary wave components (range side lobe) generated in the signal processing often mask a minute input signal.

As a result, in a communication apparatus typically represented by the conventional radar device, an attempt to improve the characteristics is made by multiplication of the weight function on a time axis. Nevertheless, the signal processing loss is still so large that an improvement is desired.

BRIEF SUMMARY OF THE INVENTION

An object of the invention is to improve the characteristics along the time axis, and to provide a weight function generating method, a reference signal generating method, a transmission signal generating apparatus, a signal processing apparatus and an antenna unit to reduce the signal processing loss and realize an ideal signal processing.

According to a first aspect of the present invention, there is provided a method of generating a weight function for attaching a predetermined characteristic to an input signal in time domain, the method comprising: transforming the time domain into the frequency domain before using the weight function; multiplying the weight function by a window function (a Hamming window, a Hanning window, a Gaussian window, a BlackmanHarris window, a FlatTop window, etc.) in frequency domain; and transforming the frequency domain to the time domain.

According to a second aspect of the present invention, there is provided a method of generating a reference signal in time domain to secure correlation with an input signal by multiplying a basic signal by a predetermined weight function in time domain, the method comprising: transforming the time domain into the frequency domain before using the weight function; multiplying the weight function by a window function ((a Hamming window, a Hanning window, a Gaussian window, a BlackmanHarris window, a FlatTop window, etc.)) in frequency domain; transforming the frequency domain to the time domain; and multiplying the basic signal by the weight function multiplied by the window function in frequency domain to generate a reference signal in time domain.

According to a third aspect of the present invention, there is provided a method of generating a reference signal in frequency domain to secure correlation with an input signal by multiplying a basic signal by a predetermined weight function in time domain, the method comprising: transforming the basic signal from the time domain to the frequency domain; and multiplying the basic signal by a window function (a Hamming window, a Hanning window, a Gaussian window, a BlackmanHarris window, a FlatTop window, etc.) in frequency domain thereby to generate the reference signal in frequency domain.

According to a forth aspect of the present invention, there is provided a transmission signal generating apparatus comprising: obtaining means for obtaining a weight function to suppress a spurious frequency component of a transmission signal which is transformed from time domain to frequency domain in advance, multiplied by a window function (a Hamming window, a Hanning window, a Gaussian window, a BlackmanHarris window, a FlatTop window, etc.) in frequency domain, and restored to the time domain; and a multiplier which multiplies the weight function and an original signal of the transmission signal, thereby to generate the transmission signal. In this case, the weight function is multiplied in accordance with a symbol rate of the transmission signal.

According to a fifth aspect of the present invention, there is provided a signal processing apparatus comprising: a receiver which receives a reflected wave of a transmission signal; complex conjugate function generating means for generating a complex conjugate function for pulse compression of a reception signal of the receiver by multiplying the transmission signal by a predetermined weight function in time domain; and pulse compression means for compressing pulses by multiplying the reception signal of the receiver by the complex conjugate function generated by the complex conjugate function generating means, wherein the complex conjugate function generating means generates the complex conjugate function by multiplying the weight function by a window function (a Hamming window, a Hanning window, a Gaussian window, a BlackmanHarris window, a FlatTop window, etc.) in frequency domain in advance and then multiplying the weight function by the transmission signal after being restored to time domain.

According to a sixth aspect of the present invention, there is provided a signal processing apparatus for analyzing a signal by Fourier transform of a signal to be analyzed into a distribution on a frequency axis, the apparatus comprising: obtaining means for obtaining a weight function to suppress a spurious leak of the signal to be analyzed which is transformed from time domain to frequency domain in advance, multiplied by a window function (a Hamming window, a Hanning window, a Gaussian window, a BlackmanHarris window, a FlatTop window, etc.) in frequency domain, and restored to the time domain; and a multiplier which multiplies the weight function and the signal to be analyzed in time domain before Fourier transform.

According to a seventh aspect of the present invention, there is provided an antenna apparatus for forming an arbitrary aperture plane distribution by controlling a power dispatching amplitude of each of a plurality of elements arranged in an array, the apparatus comprising: obtaining means for obtaining a gain weight function of each element corresponding to the aperture plane distribution which is transformed from time domain to frequency domain in advance, multiplied by a window function (a Hamming window, a Hanning window, a Gaussian window, a BlackmanHarris window, a FlatTop window, etc.) in frequency domain, and restored to time domain; and control means for controlling the power dispatching amplitude of each of the elements based on the gain weight function.

According to a eighth aspect of the present invention, there is provided a method of generating a weight function for attaching a characteristic based on a window function (a Hamming window, a Hanning window, a Gaussian window, a BlackmanHarris window, a FlatTop window, etc.) to an input signal in time domain, the method comprising: extending a waveform of the window function at a peak amplitude point to generate a waveform corresponding to a unit time of the input signal, thereby generating the weight function.

According to a ninth aspect of the present invention, there is provided a method of generating a reference signal in time domain to secure the correlation with an input signal by multiplying a basic signal by a weight function based on a window function (a Hamming window, a Hanning window, a Gaussian window, a BlackmanHarris window, a FlatTop window, etc.) in time domain, the method comprising: extending a waveform of the window function at a peak amplitude point to generate a waveform corresponding to a unit time of the input signal, thereby generating the weight function; and generating the reference signal in time domain by multiplying the basic signal by the weight function.

According to a tenth aspect of the present invention, there is provided a method of generating a reference signal in frequency domain to secure the correlation with an input signal by multiplying a basic signal by a weight function (a Hamming window, a Hanning window, a Gaussian window, a BlackmanHarris window, a FlatTop window, etc.) based on a window function in frequency domain, the method comprising: extending a waveform of the window function at a peak amplitude point to generate a waveform corresponding to a unit time of the basic signal, and transforming the waveform into the frequency domain, thereby generating the weight function; and generating the reference signal in frequency domain by multiplying the basic signal by the weight function.

According to a eleventh aspect of the present invention, there is provided a transmission signal generating apparatus comprising: obtaining means for obtaining a weight function to suppress a spurious frequency component of a transmission signal which is generated by extending a waveform of a window function (a Hamming window, a Hanning window, a Gaussian window, a BlackmanHarris window, a FlatTop window, etc.) at a peak amplitude point to generate a waveform corresponding to a unit time of the transmission signal; and a multiplier which multiplies the weight function and an original signal of the transmission signal, thereby to generate the transmission signal.

According to a twelfth aspect of the present invention, there is provided a signal processing apparatus comprising: a receiver which receives a reflected wave of a transmission signal; complex conjugate function generating means for generating a complex conjugate function to generate a weight function by extending a waveform of a window function (a Hamming window, a Hanning window, a Gaussian window, a BlackmanHarris window, a FlatTop window, etc.) at a peak amplitude point and generating a waveform corresponding to a unit time of the transmission signal and to compress pulses of a reception signal of the receiver by multiplying the weight function by the transmission signal; and pulse compression means for compressing the pulses by multiplying the reception signal of the receiver by the complex conjugate function generated by the complex conjugate function generating means.

According to a thirteenth aspect of the present invention, there is provided a signal processing apparatus for analyzing a signal by Fourier transform of a signal to be analyzed into a distribution on a frequency axis, the apparatus comprising: obtaining means for obtaining a weight function to suppress a spurious leak of the signal to be analyzed which is generated by extending a waveform of a window function (a Hamming window, a Hanning window, a Gaussian window, a BlackmanHarris window, a FlatTop window, etc.) at a peak amplitude point and generating a waveform corresponding to a unit time of the signal to be analyzed; and a multiplier which multiplies the weight function and the signal to be analyzed in time domain before Fourier transform.

According to a fourteenth aspect of the present invention, there is provided an antenna apparatus for forming an arbitrary aperture plane distribution by controlling a power dispatching amplitude of each of a plurality of elements arranged in array, the apparatus comprising: obtaining means for obtaining a gain weight function of each element corresponding to the aperture plane distribution which is generated by extending a waveform of a window function (a Hamming window, a Hanning window, a Gaussian window, a BlackmanHarris window, a FlatTop window, etc.) at a peak amplitude point and generating a waveform corresponding to the aperture plane distribution; and controlling means for controlling the power dispatching amplitude of each of the elements based on the gain weight function.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the invention are described in detail below with reference to the drawings.

First Embodiment

Figure 1:
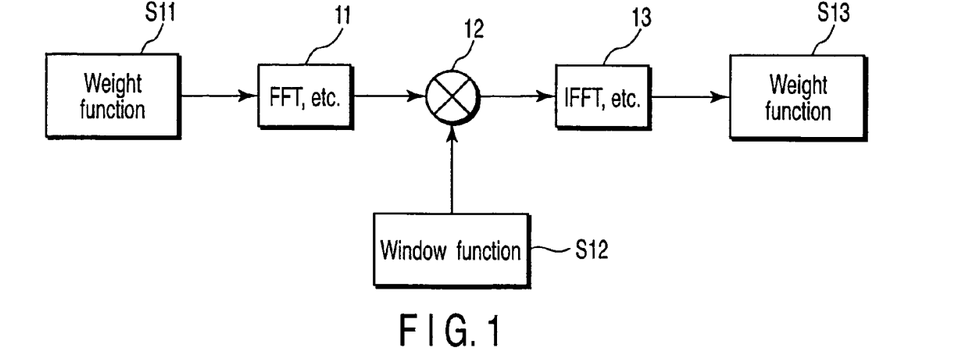
FIG. 1 is a block diagram showing a processing configuration for generating a weight function according to a first embodiment of the invention.
Figure 2A:
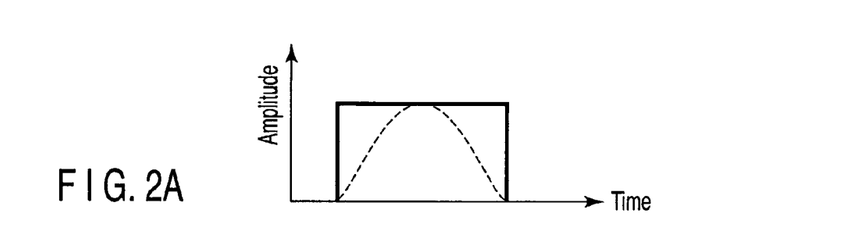
FIGS. 2A, 2B and 2C are waveform diagrams for processing according to the embodiment shown in FIG. 1.
Figure 2B:
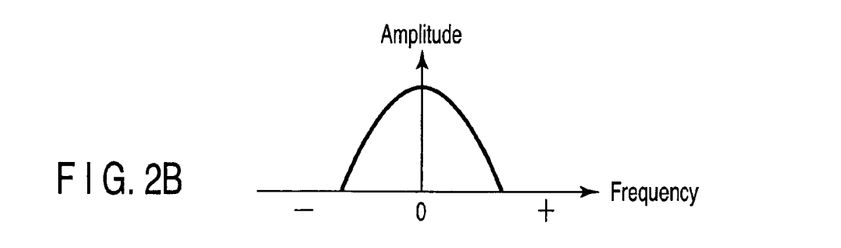
Figure 2C:
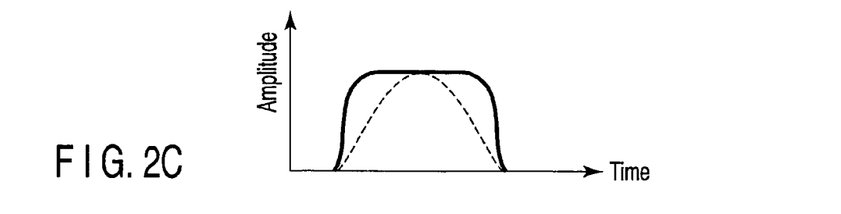

FIG. 1 is a block diagram showing a processing configuration to generate a weight function according to a first embodiment of the invention, and FIG. 1a waveform diagram for the processing thereof. In FIG. 1, assume that a weight function in time domain is selected in the range of the rectangular waveform shown in FIG. 2A. Also assume that the conventional window functions (Hamming window, Hanning window, Gaussian window, BlackmanHarris window, FlatTop window, etc.) are applied as shown by a dotted line in this range of the weight function. In the area ratio represented by time multiplied by amplitude, the worst loss of 50% develops. According to this invention, the rectangular wave S11 constituting the basis of FIG. 2A is transformed into the frequency domain by an FFT (fast Fourier transform) 11, and multiplied by the window function (BlackmanHarris window, etc.) S12 generated on frequency axis shown in FIG. 2B in a multiplier 12, after which the time domain is restored by an IFFT (inverse fast Fourier transform) 13 thereby to generate a weight function S13. The weight function thus generated is improved in the signal processing loss, and therefore, as shown by a solid line in FIG. 2C, the rise and fall on time axis become so sharp as to reduce the loss to about several percent.

Incidentally, the window function on frequency axis is not limited to the BlackmanHarris window, but the Hamming window, Hanning window, Gaussian window or FlatTop window can be also used with equal effect.

Second Embodiment

As described above, the signal processing such as FFT is widely used to multiply the window function with the aim of reducing the spurious leak. Window functions such as the Hamming window, the Hanning window, the Gaussian window, the BlackmanHarris window, the FlatTop window, etc. are known.

The multiplication process using these window functions, however, is accompanied by a large signal loss, and about one half of the signal is lost. As a method to reduce the signal loss while at the same time suppressing the unnecessary spurious leak, according to the first embodiment of the invention, the weight function based on the window function is generated by transforming the weight function in time domain into the frequency domain, and the multiplied by the window function on frequency axis, after which the signal in time domain is restored. In this method, the waveform of the window function becomes so steep at the rise and fall of the weight function that the spurious leak or the like can be reduced with substantially no loss. Since the process of generation involves the domain transform, however, the circuit for arithmetic operation is required, resulting in a longer processing time.

According to a second embodiment of the invention, therefore, a method is provided in which the signal loss is reduced, while at the same time generating the weight function in time domain to suppress the spurious leak or the like by a comparatively simple technique.

Figure 3:
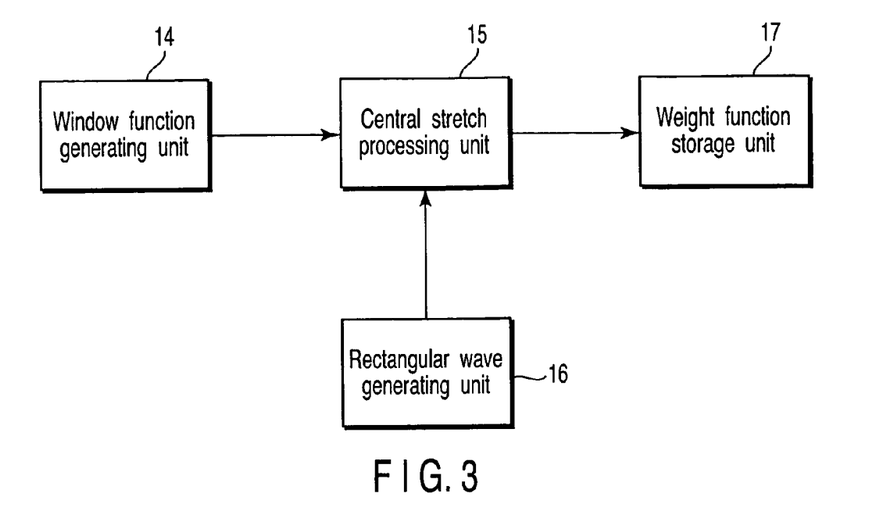
FIG. 3 is a block diagram showing a processing configuration for generating a weight function according to a second embodiment of the invention.

FIG. 3 is a block diagram showing a processing configuration for generating the weight function according to a second embodiment of the invention. First, the waveform of the window function (Hamming window, Hanning window, Gaussian window, BlackmanHarris window, FlatTop window, etc.) selected in advance by the window function generating unit 14 is generated, and sent to a central stretch processing unit 15. In the processing unit 15, a rectangular wave indicating the unit period generated by the rectangular wave generating unit 16 is fetched, and the waveform of the window function is extended rightward and leftward from the peak amplitude point thereby to generate a waveform combined with the rectangular wave. This is stored as a weight function in a weight function storage unit 17.

Now, taking the Hanning window function as an example, the processing is specifically explained with reference to FIGS. 4A to 4C.

Figure 4A:
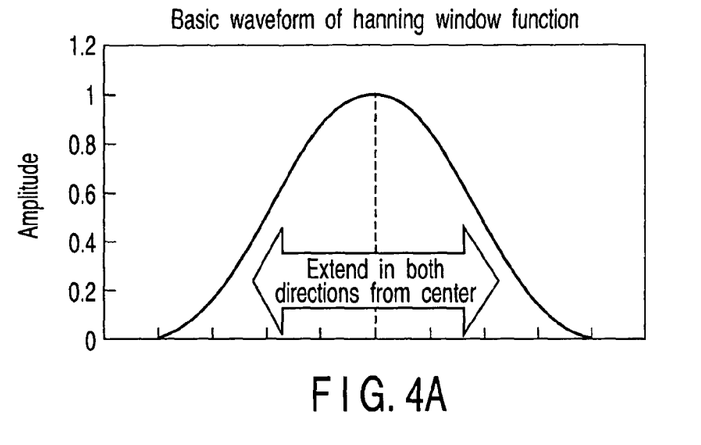
FIGS. 4A, 4B and 4C are waveform diagrams for processing according to the embodiment shown in FIG. 3.

FIG. 4A shows the waveform of the standard Hanning window function. The basic waveform w[k] of this Hanning window function is expressed as $$w[k]=0.5[1-\cos(2\pi k/n\cdot 1)]$$

where k=0, 1, 2, . . . , n·1

The direct use of this formula for the weight function would result in a great loss. According to this embodiment, therefore, this window function is extended rightward and leftward from the central peak amplitude point, and modified by combining it with the rectangular wave shown in FIG. 4B. As a result, as shown in FIG. 4C, a waveform is obtained which has the waveform of the Hanning window function at the rise and fall and maintains the peak amplitude value 1 at the middle portion. This is used to generate the weight function.

Figure 4B:
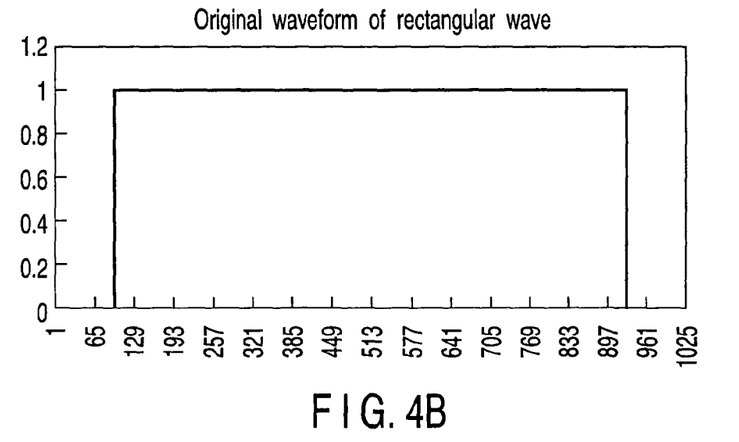
Figure 4C:
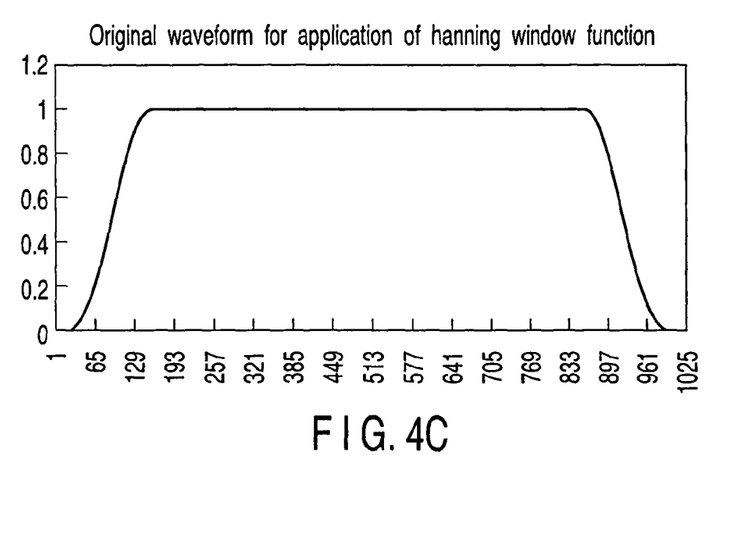
Figure 5A:
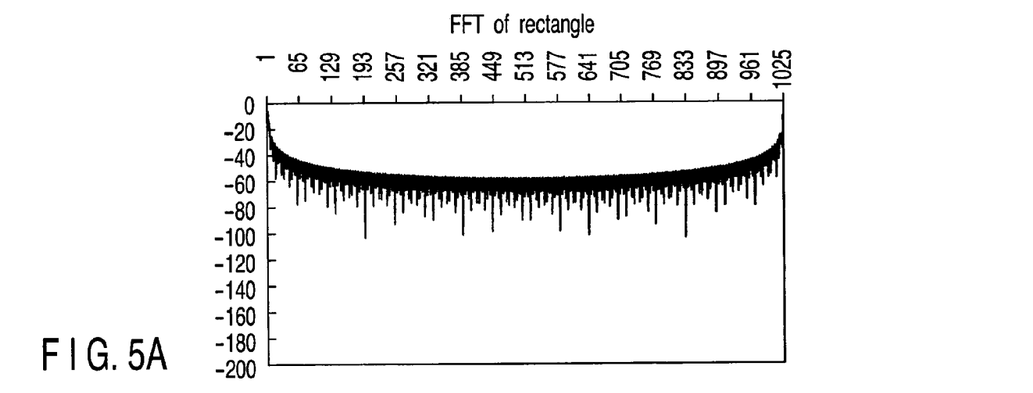
FIGS. 5A and 5B are waveform diagrams for explaining the effects of a modified window function according to the embodiment shown in FIG. 3.
Figure 5B:
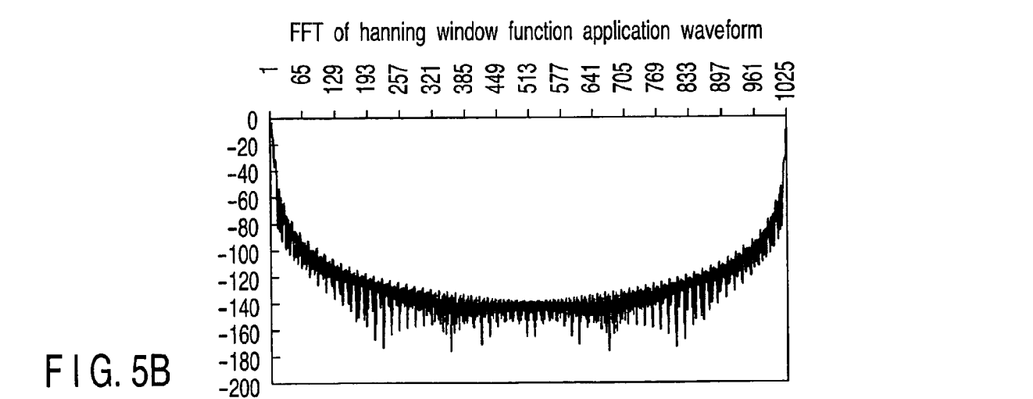

Now, assume that the rectangular wave shown in FIG. 4B is used as a weight function. The FFT processing generates a spurious leak as shown in FIG. 5A. The FFT processing of the weight function with an application waveform of the Hanning window function shown in FIG. 4C, however, reduces the spurious leak, so that the spurious leak at the central portion is improved to 80 dB or more as shown in FIG. 5B.

Third Embodiment

Figure 6:
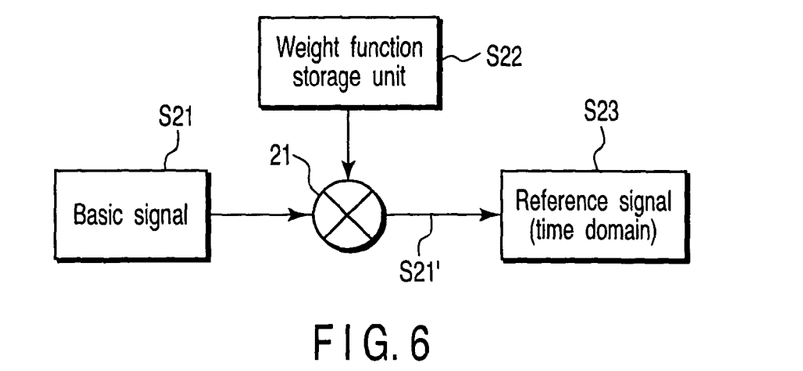
FIG. 6 is a block diagram showing a processing configuration for generating a reference signal for correlation processing according to a third embodiment of the invention.

FIG. 6 is a block diagram showing a processing configuration to generate a reference signal for correlation processing according to a third embodiment of the invention. A reference signal S21 is sent to a multiplier 21 and multiplied by a weight function S22. The weight function S22 is generated by the method according to the first or second embodiment. The reference signal S21 multiplied by the weight function S22 constitutes a reference signal S23 in time domain. The reference signal 23 thus generated is multiplied by the weight function generated in the first embodiment, and therefore the signal processing loss and the range side lobe are reduced, thereby producing an ideal waveform as a reference signal.

Fourth Embodiment

Figure 7:
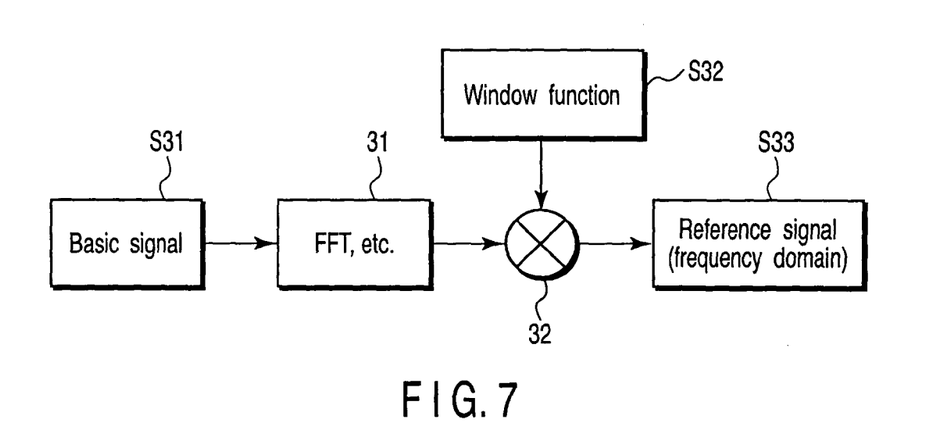
FIG. 7 is a block diagram showing another processing configuration for generating a reference signal for correlation processing according to a fourth embodiment of the invention.

FIG. 7 is a block diagram showing a processing configuration according to a fourth embodiment to generate a reference signal for correlation processing by a method different from the third embodiment.

In FIG. 7, first, the reference signal S31 is transformed into the frequency domain by the FFT 31, and multiplied by the window function S32 in frequency domain using Blackman-Harris window (which may alternatively be Hamming window, Hanning window, Gaussian window, FlatTop window, etc.) in the multiplier 32 to produce a reference signal S33 in frequency domain. Also by this method, like the reference signal in time domain obtained in the third embodiment, the signal processing loss and the range side lobe are reduced, thereby producing an ideal waveform as a reference signal.

Fifth Embodiment

Figure 8:
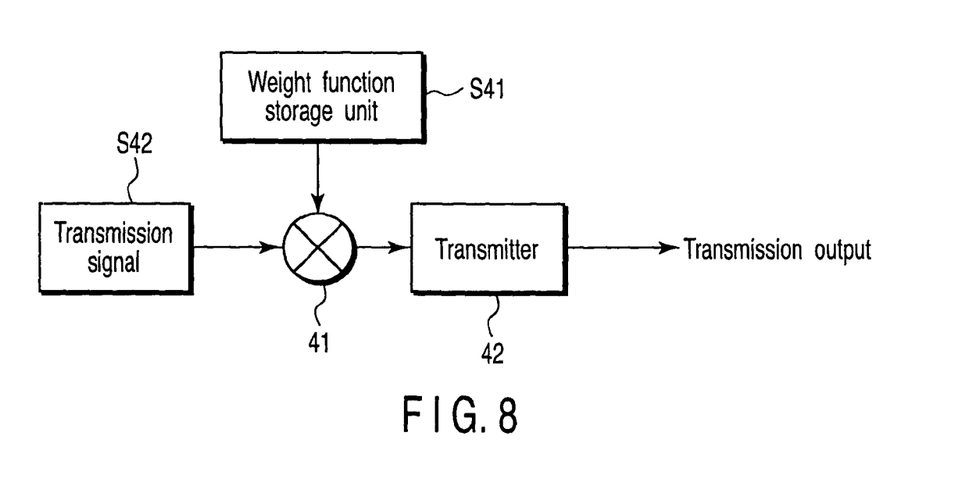
FIG. 8 is a block diagram showing a configuration in a case where the invention is applied a transmission signal generating apparatus according to a fifth embodiment of the invention.

FIG. 8 is a block diagram showing a configuration in a case where the invention is applied to a transmission signal generating apparatus according to a fifth embodiment of the invention. In FIG. 8, a weight function S41 is used to suppress the spurious frequency component of the transmission signal S42. This weight function S41 is produced by multiplying the window function, such as the BlackmanHarris window function, in frequency domain and restored to time domain by the method according to the first embodiment, or by extending the peak amplitude point of the window function by the method according to the second embodiment. The weight function S41 is multiplied by the transmission signal S42 in the multiplier 41 and output from the transmitter 42.

In this configuration, the filter loss of the weight function multiplied by the transmission signal S42 is reduced while at the same time suppressing the spurious frequency component of the transmission signal S42, thereby improving the transmission efficiency. Also, in an application to the transmission signal generating apparatus of the pulse compression radar, the spurious frequency component of the transmission pulse is reduced while at the same time reducing the range side lobe after pulse compression.

Sixth Embodiment

Figure 9:
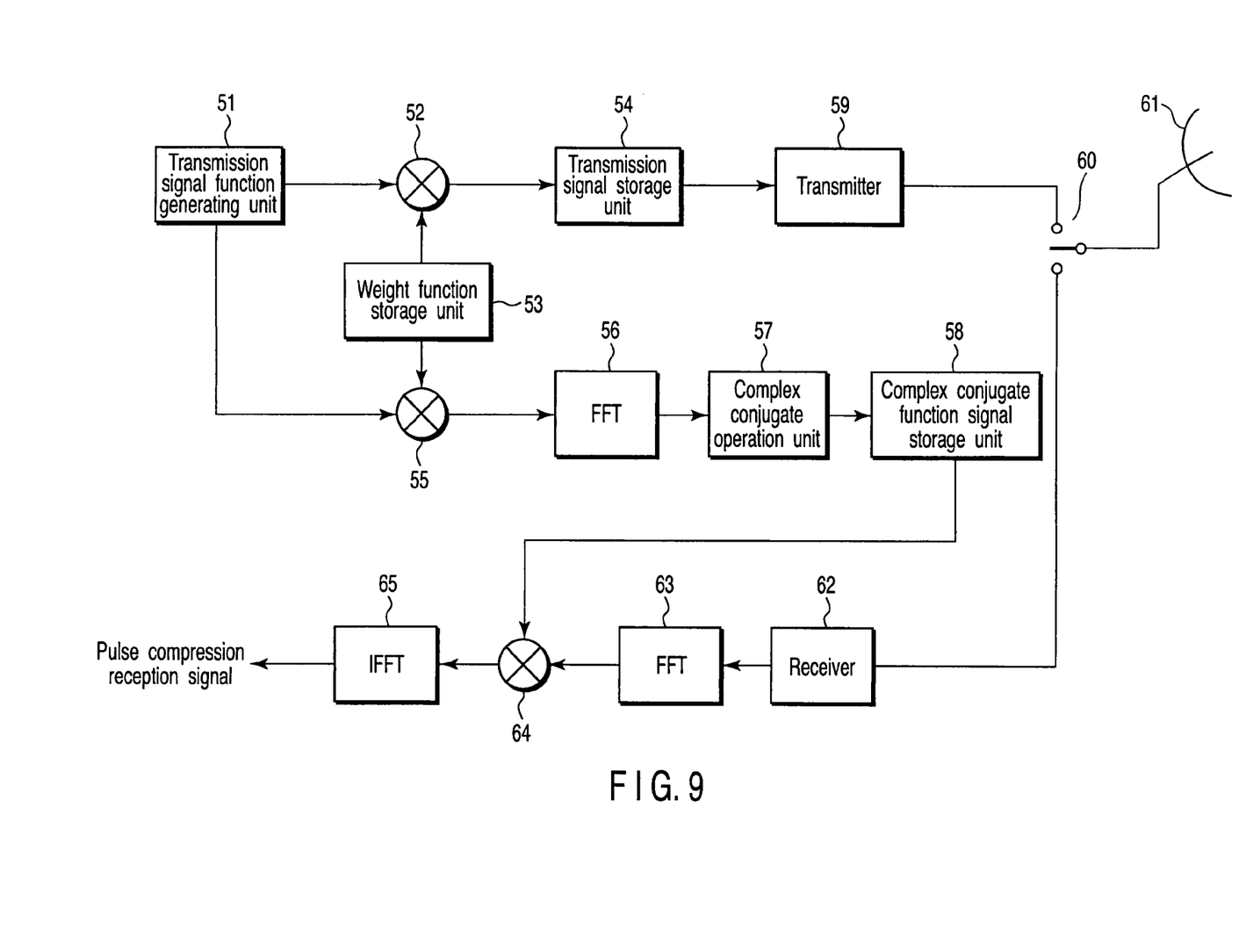
FIG. 9 is a block diagram showing a configuration in a case where the invention is applied to a pulse compression radar device according to a sixth embodiment of the invention.

FIG. 9 is a block diagram showing a configuration in a case where the invention is applied to a pulse compression radar device according to a sixth embodiment of the invention. In this radar device, the transmission signal generated in a transmission signal function generating unit 51 is supplied to a multiplier 52, and after being multiplied by the weight function stored in the weight function storage unit 53, transformed into a pulse waveform signal and stored in a transmission signal storage unit 54.

Also, the transmission signal generated in the transmission signal function generating unit 51 is used as a reference signal for correlation processing. In this case, the transmission signal, after being multiplied in the multiplier 55 by the weight function stored in the weight function storage unit 53 into a reference signal in time domain, is transformed into the frequency domain by the FFT 56. Then, a complex conjugate function signal is produced by a complex conjugate operation unit 57 and stored in a storage unit 58.

In the process, the weight function stored in the weight function storage unit 53 is produced by multiplying the window function such as the BlackmanHarris window function in frequency domain and restored to time domain by the method according to the first embodiment, or by extending the peak amplitude point of the window function by the method according to the second embodiment. The transmission signal read from the transmission signal storage unit 54, therefore, contains a lesser spurious frequency component, thereby making possible a highly efficient transmission. Also, the signal processing loss and the range side lobe of the reference signal are reduced, thereby producing an ideal complex conjugate function.

Figure 10A:
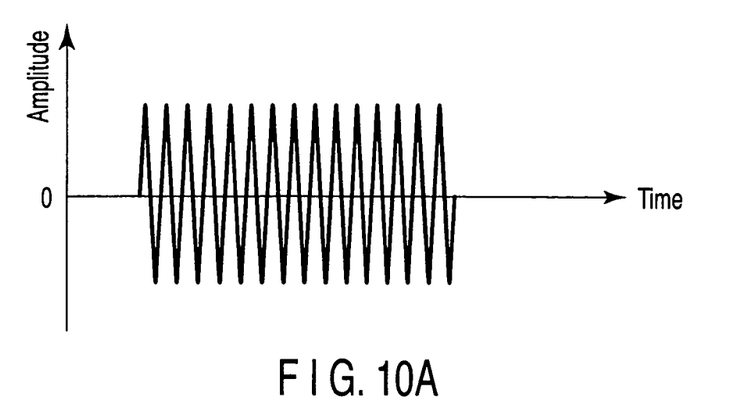
FIGS. 10A, 10B and 10C are waveform diagrams showing an example in which the transmission signal in the sixth embodiment is a CW pulse signal.
Figure 10B:
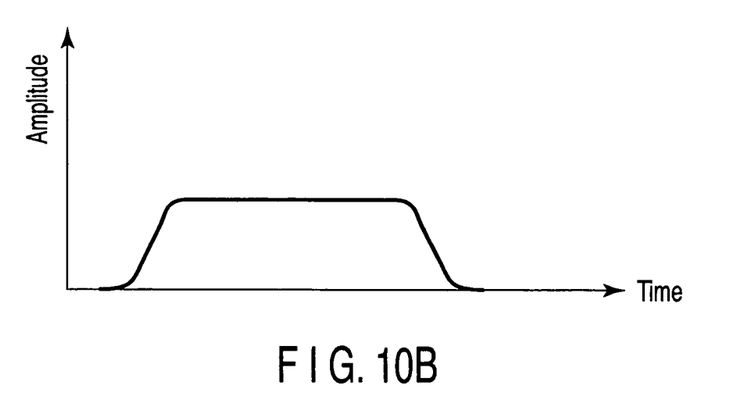
Figure 10C:
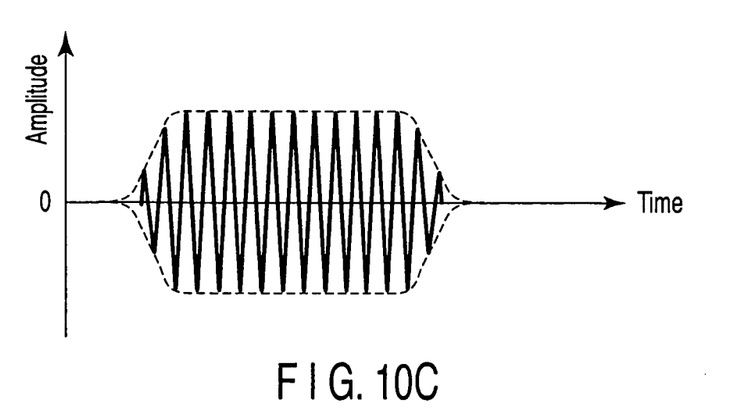

An example of the transmission signal is shown in FIGS. 10A to 10C. FIG. 10A shows a CW wave generated in the transmission signal function generating unit 51, and FIG. 10B shows a weight function multiplied by the window function in frequency domain and stored in the weight function storage unit 53. The CW wave shown in FIG. 10A, when multiplied by the weight function shown in FIG. 10B, is converted into an ideal CW pulse wave with a suppressed spurious frequency component as shown in FIG. 10C. This is also the case with the weight function generated by extending the peak amplitude point of the window function.

At the transmitting side, transmission pulses are output at regular time intervals from the transmission signal storage unit 54, sent to an antenna 61 through a transmitter 59 and a transmission/receipt switch 60, and radiated toward a target in space. Upon receipt of the reflected wave of the transmission pulses radiated from the antenna 61, the reflection signal is received by a receiver 62. This reception signal is transformed into frequency domain by the FFT 63 and input to a complex multiplier 64 in which it is subjected to complex multiplication with the complex conjugate function signal stored in the complex conjugate function signal storage unit 58. This complex multiplication is a correlation processing in which a pulse compression signal is produced by repetition of correlation with the transmission pulses. This signal is restored to a signal in time domain by an IFFT 65 and output as a pulse-compressed reception signal.

The complex conjugate function signal has a lesser signal processing loss and constitutes an ideal function with a reduced range side lobe, thereby making possible a highly accurate correlation processing. The pulse compression signal obtained by the process described above makes it possible to detect the component of the pulse compression signal which has been buried in noise and unable to be recovered in the prior art. Also, according to this embodiment, the correlation processing higher in accuracy is realized without erroneously recognizing the range side lobe as a signal.

Figure 11A:
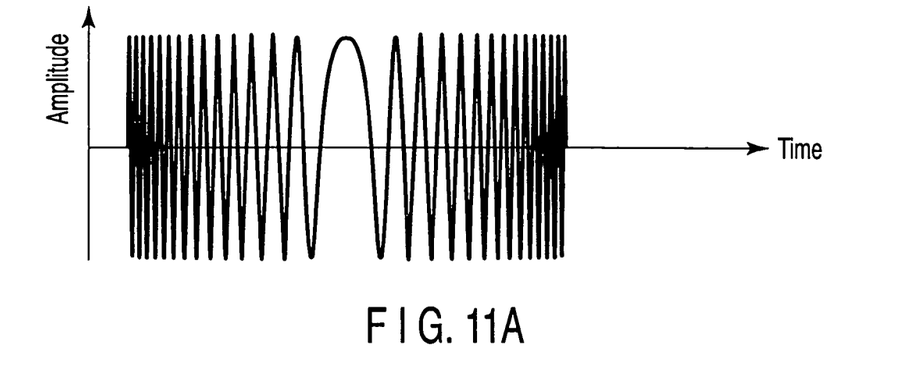
FIGS. 11A, 11B and 11C are waveform diagrams showing an example in which the transmission signal in the sixth embodiment is a chirp pulse signal.
Figure 11B:
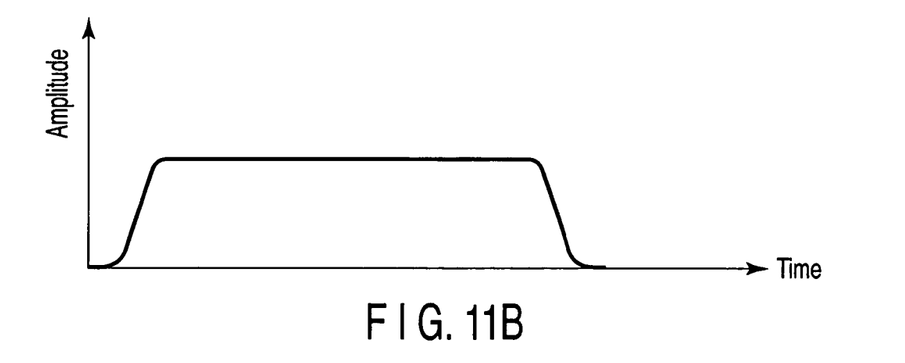
Figure 11C:
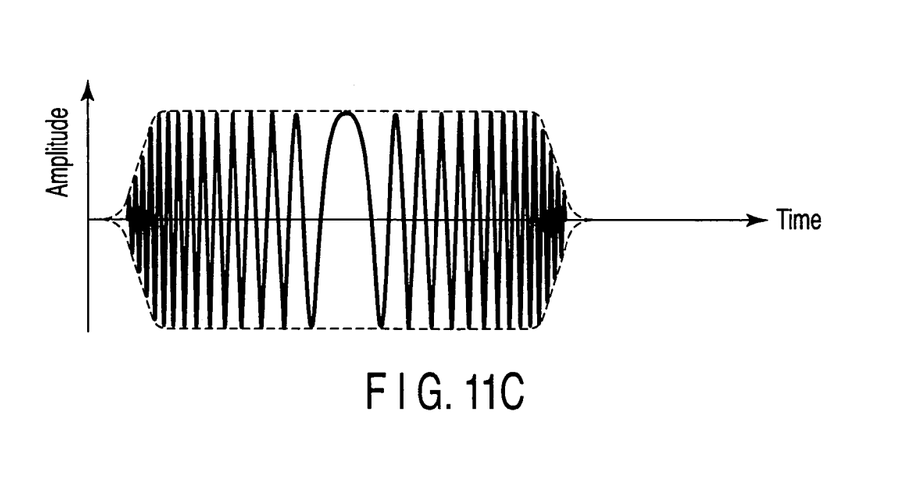

In the radar device having the configuration described above, the transmission signal waveform is not limited to the non-modulated CW pulses, but a modulated wave can also be processed equally. For example, a chirp signal changing in frequency with time is also applicable. Specifically, a frequency-modulated chirp signal shown in FIG. 11A is generated in the transmission signal function generating unit 51, and multiplied by the weight function shown in FIG. 11B and stored in the weight function storage unit 53. Then, as shown in FIG. 1C, an ideal chirp pulse waveform with a suppressed spurious frequency component is produced.

Seventh Embodiment

In the pulse compression radar device, the data reflected from a position at a short distance has a large SN ratio. In view of this, according to the seventh embodiment, there is provided a radar device of the sixth embodiment, in which the "weight function having a large loss but a greatly reduced side lobe" in the prior art is used for a short distance, while the "weight function having a small loss and capable of reducing the side lobe" according to this invention is used for a long distance. By using the apparatus this way, the side lobe can be efficiently reduced.

Specifically, pulse compression signal processing is generally required:
(1) to suppress the range side lobe for a short-distance signal, while the pulse compression gain may not be high, and
(2) to increase the pulse compression gain for a long-distance signal, while the range side lobe may not be suppressed greatly.

Figure 12A:
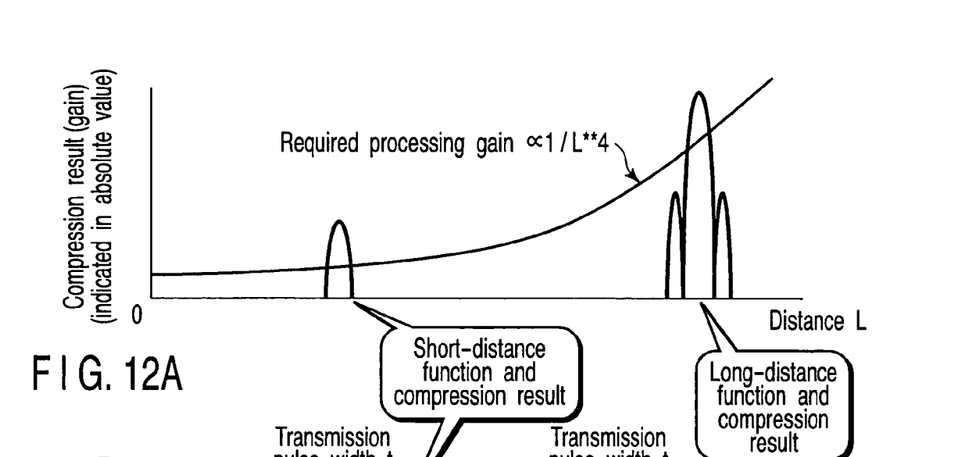
FIGS. 12A and 12B are diagrams for explaining the effects of using a weight function differently according to a distance in a radar device.
Figure 12B:
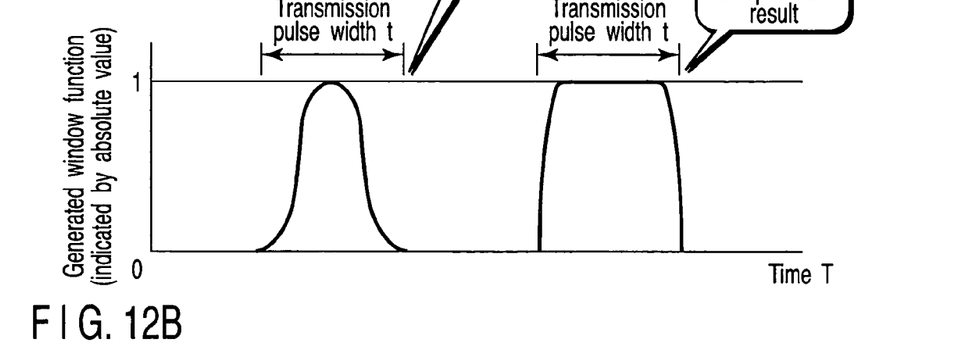

The contradictory requirements described above are summarized as illustrated in FIG. 12A. The short-distance function is shown on the left side in FIG. 12B, and the long-distance function on the right side in FIG. 12B. The basic function is divided into a plurality of forms as shown in FIG. 12, so that a more ideal pulse compression is made possible. In such a case, the short-distance function and the long-distance function shown in FIG. 12B can be generated by adjusting the band of the window function to an optimum value.

In the radar device shown in FIG. 9, the process corresponding to the distance described above can be executed by the method according to the first or second embodiment in such a manner that the weight function corresponding to each of a plurality of window functions selected in advance in accordance with the distance is generated and stored in the weight function storage unit 53. A reference signal corresponding to each weight function is generated, and the complex conjugate function signal determined from the reference signals is stored in the storage unit 58. The complex conjugate function signal is selectively switched in accordance with the distance of search and multiplied by the reception signal. As a result, the process satisfying the requirements (1) and (2) described above can be realized.

Eighth Embodiment

Figure 13:
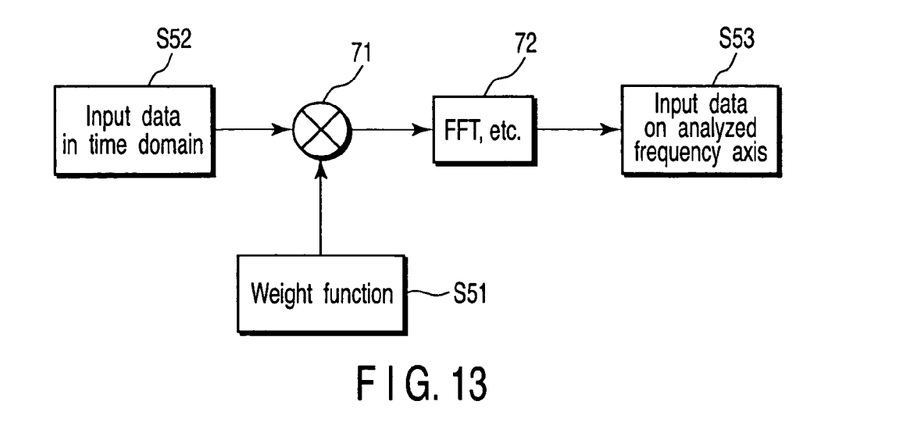
FIG. 13 is a block diagram showing a processing configuration in a case where the invention is applied to a signal processing device for carrying out signal analysis according to an eighth embodiment of the invention.

FIG. 13 is a block diagram showing a processing configuration in a case where the invention is applied to a signal processing device to subject a signal (input data in time domain) to Fourier transform into the distribution on frequency axis for signal analysis according to an eighth embodiment of the invention. In FIG. 13, a weight function S51 is intended to suppress the spurious leak and generated by either a method according to the first embodiment or a method according to the second embodiment. In the method according to the first embodiment, the weight function is generated by being transformed from time domain to frequency domain in advance and multiplied by the window function (Hamming window, Hanning window, Gaussian window, BlackmanHarris window, FlatTop window, etc.) in frequency domain, after which it is restored to time domain. In the method according to the second embodiment, on the other hand, the window function is extended at the peak amplitude point to produce the weight function. This weight function S51 is multiplied by the input signal in time domain in the multiplier 71, and transformed into frequency domain by the FFT (Fourier transform) 72 thereby to obtain the input data analysis result S53 on frequency axis.

As described above, the weight function generated in time domain by the processing method according to the first embodiment has a lesser signal processing loss, and therefore by multiplying the weight function in time domain, the signal processing loss of the input signal thereof is reduced.

Figure 14:
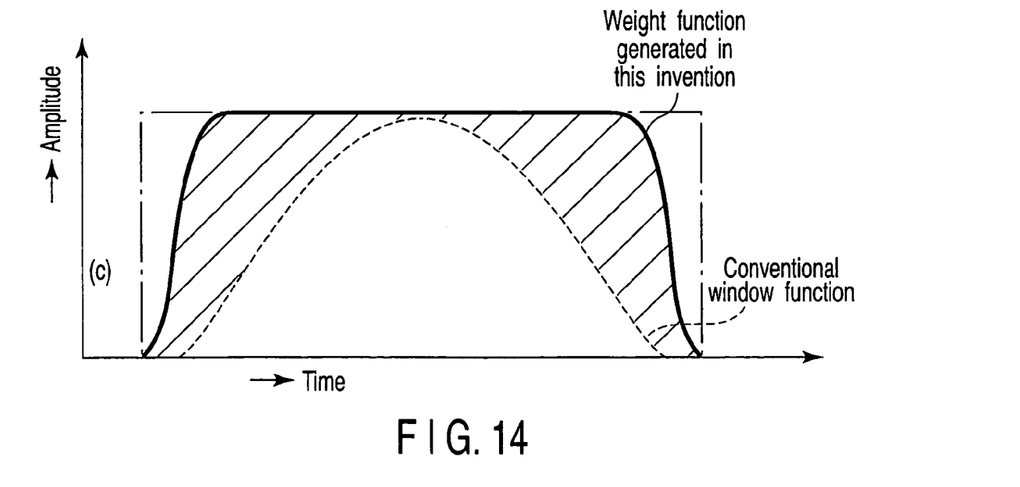
FIG. 14 is a waveform diagram for explaining the effects of the eighth embodiment of the invention.

FIG. 14 shows this effect as compared with the prior art. In FIG. 14, the one-dot chain line indicates the processing section, the dotted line the window function in time domain used in the prior art, and the solid line the weight function in time domain multiplied by the window function in frequency domain according to the invention. As apparent from the drawing, the signal processing loss is remarkably improved in the processing section. As a result, the accuracy of the signal analysis processing can be remarkably improved. This is also the case with the weight function generated by extending the window function at the peak amplitude point.

Ninth Embodiment

A narrow bandpass filter is inserted in the actual transceiver to suppress the interference from outside the band. This narrow bandpass filter requires a sharp suppression characteristic. This suppression characteristic can be realized at the sacrifice of the loss of the filter pass group delay characteristic required to maintain the signal quality. In the prior, therefore, the group delay characteristic of the narrow bandpass filter is unavoidably deteriorated and a phase distortion of the basic signal is developed. This phase distortion causes a failure to achieve the compression gain target and the deterioration of the range side lobe in the correlation process such as pulse compression.

Figure 15:
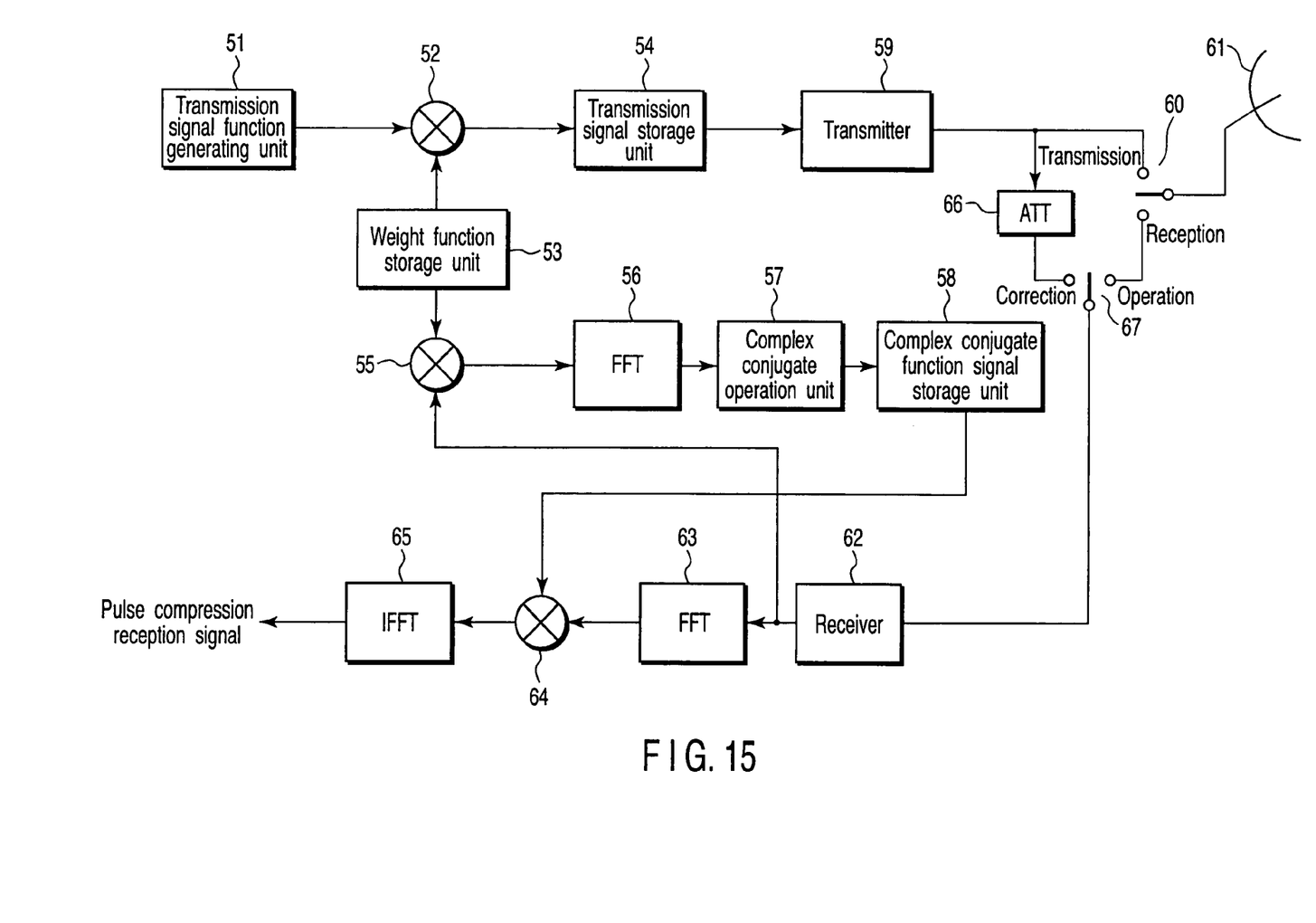
FIG. 15 is a block diagram showing a pulse compression radar device having a processing configuration to avoid the problem of distortion according to a ninth embodiment of the invention.

FIG. 15 is a block diagram showing a processing configuration to avoid the distortion problem in the compression radar device of FIG. 9 according to a ninth embodiment of the invention. In FIG. 15, the same component elements as those in FIG. 9 are designated by the same reference numerals, respectively, and not described again.

In FIG. 15, numeral 66 designates an attenuator to attenuate the output of the transmitter 59, and numeral 67 a switch to selectively switch between the correction mode and the operation mode of the radar device. In correction mode, the transmission signal output from the attenuator 66 is supplied directly to the receiver 62 through the switch 67, and the output of the receiver 62 is supplied to the multiplier 55 to multiply the weight function stored in the weight function storage unit 53 thereby to produce a reference signal on time axis. This reference signal is subjected to fast Fourier transform in the FFT 56, so that a complex conjugate function is determined in the complex conjugate operation unit 57 and stored in the complex conjugate function signal storage unit 58.

In operation mode, on the other hand, the switch 67 is connected to the transmission/receiving switch 60 to transmit/receive the normal transmission pulses. In the process, the reception signal output from the receiver 62 is transformed from time domain to frequency domain in the FFT 63, subjected to complex multiplication in the complex multiplier 64 by the complex conjugate function signal stored in the complex conjugate function signal storage unit 58, restored to time domain in the IFFT 65 and output as a pulse compression reception signal.

Specifically, this processing configuration has the feature that the transmission signal is received directly and the correlation process is executed with this signal as a reference signal to solve the distortion program. In this way, the correlation processing (pulse compression) can be executed in such a manner that the transmission signal is received directly as a reference signal, this reference signal is subjected to the FFT process by multiplying the weight function, a complex conjugate function is obtained by the complex conjugate processing, and this complex conjugate function is subjected to the complex multiplication by the actual reception signal subjected to the FFT processing, followed by the IFFT processing.

In the process, the weight function stored in the weight function storage unit 53 is obtained by multiplying the window function such as the BlackmanHarris window function in frequency domain and restoring it to time domain by the method according to the first embodiment, or by extending the window function at the peak amplitude point by the method according to the second embodiment. The reference signal obtained by multiplying the weight function, therefore, has a lesser signal processing loss and a lesser range side lobe. Thus, an ideal complex conjugate function is obtained from this signal. As a result, the reception signal subjected to the complex multiplication of the complex conjugate function signal is also reduced in signal processing loss and range side lobe. In this way, a highly accurate correlation processing is executed.

Tenth Embodiment

Next, an application of the invention to the weight function to determine the aperture plane distribution of a phased array antenna unit according to a tenth embodiment is explained.

As well known, the antenna unit has a characteristic called aperture plane distribution. The aperture plane distribution is defined as the distribution of the antenna plane, and the gain is known to be higher, the greater the uniformity of the aperture plane. This is inconveniently accompanied, however, by an increased side lobe level of the antenna pattern. Normally, the side lobe is reduced by securing the distribution of the aperture plane. The side lobe is desirably reduced without excessively reducing the antenna gain.

The antenna aperture plane distribution is explained with reference to the phased array antenna according to an embodiment. The phased array antenna has a uniform plane, and the concept similar to that of the normal antenna aperture plane distribution can be introduced by adjusting the amplitude at the time of transmission or receiving. In the phased array antenna, the side lobe of the antenna can be remarkably reduced by replacing the weight function on time axis by the spatial one.

Figure 16:
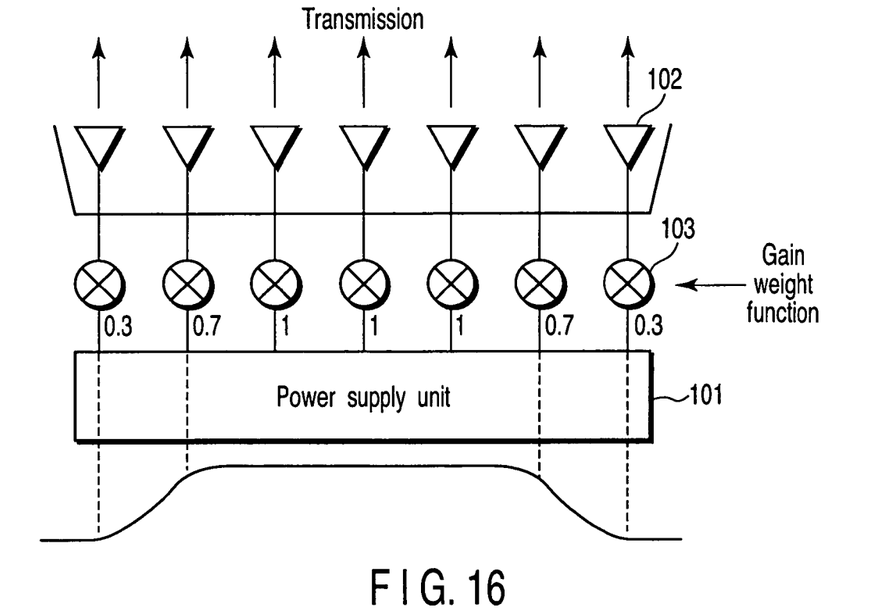
FIG. 16 is a block diagram schematically showing a configuration at a transmitting side of a phased array antenna device to which the invention is applied.
Figure 17:
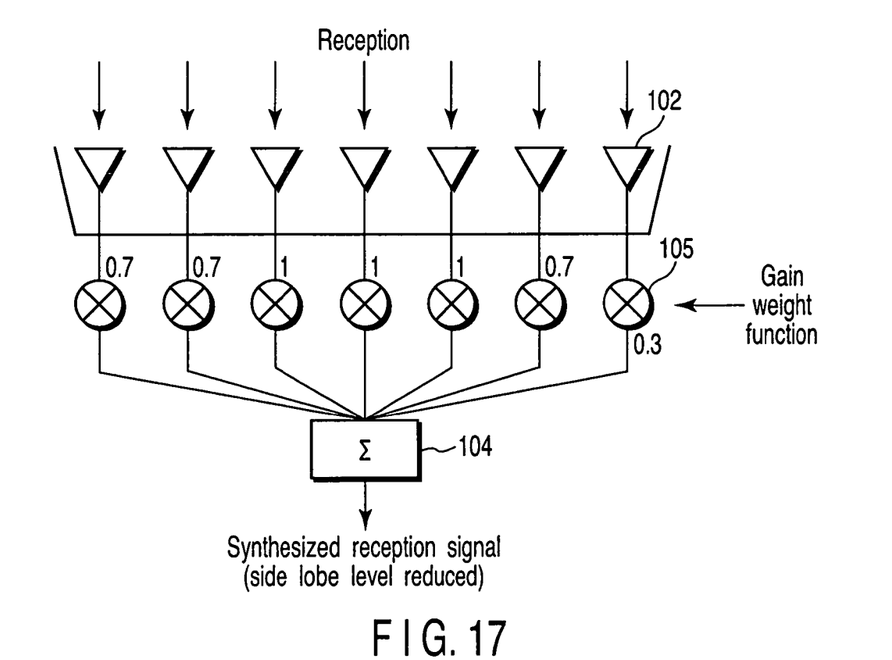
FIG. 17 is a block diagram schematically showing a configuration at a receiving side of the phased array antenna device to which the invention is applied.

FIGS. 16 and 17 are block diagrams schematically showing the configuration of the phased array antenna units at the transmitting and receiving sides, respectively, according to the invention. In FIG. 16, a level adjuster 103 is inserted in the power feed path from a power feeder 101 to each antenna element 102, and by multiplying a gain weight function for each path and by thus adjusting the amplitude, the antenna aperture plane distribution is formed. Also, in FIG. 17, the reception signal from each antenna element 102 is combined by a synthesizer 104 in such a manner that the gain weight function is multiplied in the level adjuster 105 in each receiving path and the amplitude adjusted thereby to form the antenna aperture plane distribution.

Each gain weight function is generated by a method in which the window function such as the BlackmanHarris window function is multiplied in frequency domain and the time domain is restored according to the first embodiment or by a method in which the window function is extended at the peak amplitude point according to the second embodiment. The gain weight function generated in this way is used as an antenna aperture plane distribution. Thus, the beam synthesis loss is minimized, while at the same time suppressing the antenna pattern and the side lobe effectively.

Other Embodiments

Embodiments of the invention are described above mainly with reference to applications to the radar device. Nevertheless, this invention is not limited to such embodiments, and is also applicable to signal processing as a whole. Also, the embodiments described above refer to external devices connected by LAN as an example. The invention is applicable, however, also to other interface connections such as the iLink connection and USB connection with equal effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for generating a weight function, comprising:
    a first transformer circuit for transforming a weight function in time domain into a weight function in frequency domain before using the weight function;
    a multiplier circuit connected to the first transformer for multiplying the weight function in the frequency domain by a window function originally generated in the frequency domain, wherein the window function is any one of a Hanning window, a Gaussian window and a Blackman-Harris window; and
    a second transformer circuit connected to the multiplier for transforming the multiplied weight function in the frequency domain to the time domain.

2. An apparatus according to claim 1, wherein said window function is not generated by transformation of a time-domain function into the frequency domain.

3. An apparatus for generating a reference signal in time domain to secure correlation with an input signal by multiplying a basic signal by a predetermined weight function in time domain, comprising:
    a first transformer circuit for transforming a weight function in time domain into a weight function in frequency domain before using the weight function;

a first multiplier circuit connected to the first transformer for multiplying the weight function in the frequency domain by a window function originally generated in the frequency domain, wherein the window function is any one of a Hanning window, a Gaussian window and a Blackman-Harris window;

a second transformer circuit connected to the first multiplier for transforming the multiplied weight function in the frequency domain to said predetermined weight function in the time domain; and a second multiplier circuit for multiplying the basic signal by the predetermined weight function to generate the reference signal in the time domain.

4. An apparatus according to claim 3, wherein said window function is not generated by transformation of a time-domain function into the frequency domain.

5. A transmission signal generating apparatus comprising:
obtaining means for obtaining a weight function to suppress a spurious frequency component of a transmission signal, said weight function being transformed from time domain to frequency domain in advance, multiplied by a window function originally generated in the frequency domain, and restored to the time domain, wherein the window function is any one of a Hanning window, a Gaussian window and a Blackman-Harris window; and a multiplier circuit connected to the obtaining means which multiplies the weight function and an original signal of the transmission signal, thereby to generate the transmission signal.

6. A transmission signal generating apparatus according to claim 5, wherein
the weight function is multiplied in accordance with a symbol rate of the transmission signal.

7. A transmission signal generating apparatus according to claim 5, wherein said window function is not generated by transformation of a time-domain function into the frequency domain.

8. A signal processing apparatus for analyzing a signal by Fourier transform, comprising:
obtaining means for obtaining a weight function to suppress a spurious leak of the signal to be analyzed, said weight function being transformed from time domain to frequency domain in advance, multiplied by a window function originally generated in the frequency domain, and restored to the time domain, wherein the window function is any one of a Hanning window, a Gaussian window and a Blackman-Harris window; and a multiplier circuit connected to the obtaining means which multiplies the weight function and the signal to be analyzed in time domain.

9. A signal processing apparatus according to claim 8, wherein said window function is not generated by transformation of a time-domain function into the frequency domain.

10. An apparatus for generating a weight function for attaching a characteristic based on a window function to an input signal in time domain, comprising:
a window function generating circuit to generate a first window function, wherein the window function is any one of a Hanning window, a Gaussian window and a Blackman-Harris window; and a waveform extension circuit connected to the window function generating circuit for extending a width of a waveform of the first window function at a peak amplitude point to generate a waveform corresponding to a unit time of the input signal, thereby generating the weight function.

11. An apparatus for generating a reference signal in time domain to secure the correlation with an input signal by multiplying a basic signal by a weight function based on a window function in time domain, comprising:
a window function generating circuit to generate a first window function, wherein the window function is any one of a Hanning window, a Gaussian window and a Blackman-Harris window;

a waveform extension circuit connected to the window function generating circuit for extending a width of a waveform of the first window function at a peak amplitude point to generate a waveform corresponding to a unit time of the input signal, thereby generating the weight function; and a multiplier circuit for multiplying a basic signal by the weight function to produce the reference signal in time domain.

12. A transmission signal generating apparatus comprising:
obtaining means for obtaining a weight function to suppress a spurious frequency component of a transmission signal;

an extension circuit for extending a width of a waveform of a window function at a peak amplitude point to generate a waveform corresponding to a unit time of the transmission signal, wherein the window function is any one of a Hanning window, a Gaussian window and a Blackman-Harris window; and a multiplier circuit connected to the extension circuit which multiplies the weight function and an original signal of the transmission signal, thereby to generate the transmission signal.

13. A transmission signal generating apparatus, according to claim 12, wherein
the weight function is multiplied in accordance with a symbol rate of the transmission signal;

the pulse compression means compresses the pulses by switching the complex conjugate function corresponding to a search distance from the complex conjugate function storage unit.

14. A signal processing apparatus, comprising:
obtaining means for obtaining a weight function to suppress a spurious leak of a signal to be analyzed;

an extension circuit for extending a width of a waveform of a window function at a peak amplitude point and generating a waveform corresponding to a unit time of the signal to be analyzed, wherein the window function is any one of a Harming window, a Gaussian window and a Blackman-Harris window; and a multiplier circuit connected to the extension circuit which multiplies the weight function and the signal to be analyzed in time domain before Fourier transform.

* * * * *